(12) United States Patent
Mei

(10) Patent No.: US 7,521,313 B2
(45) Date of Patent: Apr. 21, 2009

(54) THIN FILM DEVICE ACTIVE MATRIX BY PATTERN REVERSAL PROCESS

(75) Inventor: Ping Mei, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 459 days.

(21) Appl. No.: 11/037,887

(22) Filed: Jan. 18, 2005

(65) Prior Publication Data

US 2006/0160278 A1 Jul. 20, 2006

(51) Int. Cl.
*H01L 21/8238* (2006.01)
(52) U.S. Cl. .................. 438/229; 438/320; 438/339; 438/364; 438/669
(58) Field of Classification Search ............... 438/739, 438/618, 622, 180, 229, 233, 320, 364, 339, 438/FOR. 495, FOR. 185, 669, 748, 749, 438/750, 751, FOR. 208, 587; 257/208, 257/723, 773, 72
See application file for complete search history.

(56) References Cited

U.S. PATENT DOCUMENTS

| | | | |
|---|---|---|---|
| 6,808,646 B1 | 10/2004 | Jeans | |
| 7,195,950 B2 * | 3/2007 | Taussig | ...... 438/100 |
| 7,202,179 B2 * | 4/2007 | Taussig et al. | ...... 438/739 |
| 2004/0002216 A1 | 1/2004 | Taussig et al. | |
| 2004/0217085 A1 | 11/2004 | Jeans | |
| 2006/0157443 A1 * | 7/2006 | Mei | ...... 216/41 |

* cited by examiner

*Primary Examiner*—Phuc T Dang
*Assistant Examiner*—Thanh Y Tran

(57) ABSTRACT

This invention provides a method of fabricating an active matrix of thin film devices through a pattern reversal self aligned imprint lithography (SAIL) process. The method includes providing a substrate and depositing at least one layer of material upon the substrate. A pattern is then established upon the layer of material, the pattern providing at least one exposed area and at least one covered area of the layer of material. The exposed areas are treated to provide etch resistance to the material and reverse the pattern. Subsequent etching removes the etch susceptible material, the etch resistant material remaining. A thin-film stack is then deposited upon the remaining etch resistant material. These deposited thin-films are then processed in accordance with the desired characteristics of the thin film devices.

9 Claims, 18 Drawing Sheets

THIN FILM DEVICE ACTIVE MATRIX BY PATTERN REVERSAL PROCESS

FIELD OF THE INVENTION

The present invention relates generally to the field of forming semiconductor devices and, in particular, to an improved pattern reversal process for the making of an active matrix of thin film devices.

BACKGROUND

Socially and professionally, most people rely upon video displays in one form or another for at least a portion of their work and/or recreation. With a growing demand for large screens and high definition television (HDTV), cathode ray tubes (CRTs) have largely given way to displays composed of liquid crystal devices (LCDs), light-emitting diodes (LEDs), plasma and front and rear projection systems.

A CRT operates by a scanning electron beam exciting phosphorous-based materials on the back side of a transparent screen, wherein the intensity of each pixel is commonly tied to the intensity of the electron beam. With an LED and plasma display, each pixel is an individual light-emitting device capable of generating its own light. With an LCD display, each pixel is a transient light-emitting device, individually adjusted to permit light to shine through or reflect through the pixel by altering the polarization of the transmitted or reflected light.

As LCD, plasma and LED screens do not utilize a large tube, as in a CRT, LCD, plasma and LED screens may be quite thin and, in many cases, are lighter than comparable CRT displays. As such, large and small flat screen displays can be provided to improve the portability of laptop computers, video displays in vehicles and airplanes, and information displays that are mounted or set in eye-catching locations.

A plurality of thin film devices, such as transistors, are typically incorporated into the screens of such flat screen devices as LCD, plasma and LED displays. Specifically, one or more transistors are commonly used to control the behavior of each pixel within the display. The individual nature of each pixel of an LED, plasma or LCD display introduces the possibility that each pixel may provide a different quantity of light. One pixel may be brighter or darker than another, a difference that may be quite apparent to the viewer.

As a flat screen display may incorporate hundreds of thousands of transistors, great care is generally applied in the fabrication of LED, plasma and LCD displays in an attempt to ensure that the pixels (and more specifically, the backplane transistors controlling the pixels) are as uniform and consistently alike as is possible. Frequently, especially with large displays, quality control measures discard a high percentage of displays before they are fully assembled. As such, displays are generally more expensive than they otherwise might be, as the manufacturers must recoup the costs for resources, time and precise tooling for both the acceptable displays and the unacceptable displays.

Traditionally, thin film devices have been formed through processes such as photolithography. In a photolithographic process, a substrate is provided and at least one material layer is uniformly deposited upon the substrate. A photo-resist layer, also commonly known simply as a photoresist, or even a resist, is deposited upon the material layer, typically by a spin coating machine. A mask is then placed over the photoresist and light, typically ultra-violet (UV) light, is applied through the mask to expose portions of the photoresist. During the process of exposure, the photoresist undergoes a chemical reaction. Generally, the photoresist will react in one of two ways.

With a positive photoresist, UV light changes the chemical structure of the photoresist so that it is soluble in a developer. What "shows" therefore goes, and the mask provides an exact copy of the patterns which are to remain—such as, for example, the trace lines of a circuit. Photolithography may also be considered a 2D process, in that each layer of material is deposited and then masked. Although 3D structure may be created by stacking layers patterned via the 2D process, there is no inherent alignment feature between the layers.

A negative photoresist behaves in the opposite manner— the UV exposure causes it to polymerize and not dissolve in the presence of a developer. As such, the mask is a photographic negative of the pattern to be left. Following the developing with either a negative or positive photoresist, blocks of photoresist remain. These blocks may be used to protect portions of the original material layer, or serve as isolators or other components.

Very commonly, these blocks serve as templates during an etching process, wherein the exposed portions of the material layer are removed, such as, for example, to establish a plurality of conductive rows.

The process may be repeated several times to provide the desired thin film devices. As such, new material layers are set down on layers that have undergone processing. Such processing may inadvertently leave surface defects and/or unintended contaminant particles in the prior layers.

With respect to transistors, there are two types—bottom-gate transistors and top gate transistors. Bottom-gate transistors incorporating amorphous silicon are generally more desirable then top gate amorphous silicon transistors. This is due in part to better device performance in terms of a higher electron field effect mobility and a lower off-state leakage current.

Although desirable, the fabrication of bottom-gate amorphous silicon transistors requires precise alignment between source/drain contacts and the gate electrode. In a typical bottom-gate transistor structure, a metal gate material is formed on a substrate. A desired gate electrode is then formed by a conventional photolithographic process.

Summarized, a dielectric layer is formed over the gate metal, and a layer of active material in which a channel will be formed is deposited over the dielectric layer. In many instances a contact layer, such as, for example, a-Si:H doped to be N+, is deposited over the dielectric layer prior to the deposition of a top metal layer.

Lithography, or a similar process, and subsequent etching processes are then employed to remove a section of the top metal layer and contact layer (if provided), lying roughly over the gate metal. This removal forms the gate and drain contact electrodes. Since photolithography processes and etching process may introduce at least 1μ alignment error, there are overlaps between source/drain contacts and the gate electrode by design to ensure the electrical continuity between the source and drain when the TFT channel is at an on state.

While leaving the overlaps alleviates the alignment problem, there are several drawbacks and therefore reasons to minimize the amount of overlap. For example, the overlap causes the channel to be longer than otherwise would be necessary, which in turn limits the reduction in size of the overall structure. The TFT source to drain current is proportional to the ratio of the channel width to the channel length. Reducing the overlaps shrinks the length of the transistor, and thus provides more room for other components that may be required for an eventual device.

Furthermore, and perhaps most importantly, parasitic capacitance is established between the source/drain electrode material and the gate material in the areas of overlap. This parasitic capacitance results in feed-through voltage. When the TFT is incorporated into a display backplane to control a display pixel, this may result in inadvertent turning on of the pixel. This uncontrolled behavior results in image flicker (inaccuracy in the Off-to-On transition of the TFT), and sticking (inaccuracy in the On-to-Off transition of the TFT) in the case of a display device. In the case of a sensor device, parasitic capacitance results in readout noise.

Further, due to variations in the substrate, resolution of the lithography, alignment of the lithographic mask and other factors, the overlap may vary from TFT to TFT in an array. Such variance thus permits a variance in feed-through voltage from TFT to TFT. More simply stated, the plurality of TFTs in the array will have a range of different performance factors.

Photolithography is a precise process applied to small substrates. In part, this small-scale application is due to the high cost of the photo masks. For the fabrication of larger devices, typically, rather than employing a larger and even more costly photo mask, a smaller mask is repeatedly used—a process that requires precise alignment.

As a photolithographic process typically involves multiple applications of materials, repeated masking and etching, issues of alignment between the thin film layers is of high importance. A photolithographic process is not well suited for formation of thin film devices on flexible substrates, where expansion, contraction or compression of the substrate may result in significant misalignment between material layers, thereby leading to inoperable thin film devices. In addition, a flexible substrate is not flat—it is difficult to hold flat during the imprinting process and thickness and surface roughness typically cannot be controlled as well as they can with glass or other non-flexible substrates.

The issue of flatness in photolithography can be a problem because the minimum feature size that can be produced by a given imaging system is proportional to the wavelength of the illumination divided by the numerical aperture of the imaging system. However, the depth of field of the imaging system is proportional to the wavelength of the illumination divided by the square of the numerical aperture. Therefore, as resolution is increased, the flatness of the substrate quickly becomes the critical issue.

With respect to the flat screen displays introduced above, use of flexible substrates for the internal backplane controlling the pixels is often desired. Such a flexible substrate can provide a display with flexible characteristics. A flexible substrate may also be easier to handle during fabrication and provide a more mechanically robust display for the user.

Hence, there is a need for a process to provide at least one thin film device that overcomes one or more of the drawbacks identified above.

SUMMARY

The present disclosure advances the art by providing a pattern reversal process in forming at least one thin film device.

In particular, and by way of example only, according to an embodiment, provided is a method of fabricating an active matrix of thin film devices, including providing a substrate; and utilizing a self-aligned imprint lithography (SAIL) process with pattern reversal to form an active matrix array of thin film devices.

DETAILED DESCRIPTION

Figure 1:
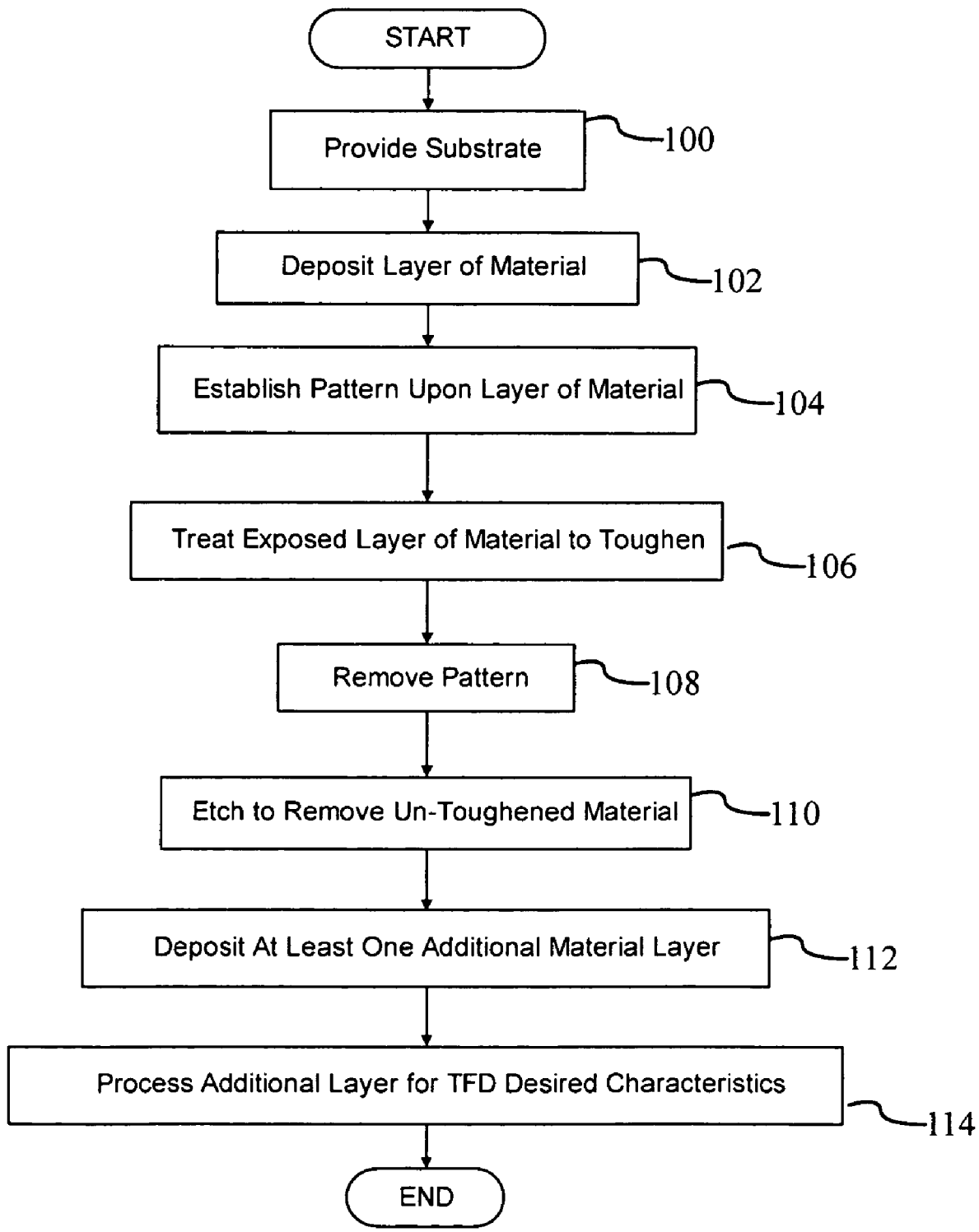
FIG. 1 is a high level flowchart of at least one method embodiment.

Before proceeding with the detailed description, it is to be appreciated that the present teaching is by way of example, not by limitation. Thus, although the instrumentalities described herein are for the convenience of explanation shown and described with respect to exemplary embodiments, it will be appreciated that the principles herein may be applied equally in other types of thin film devices ("TFDs").

In at least one embodiment, the method for forming at least one TFD incorporates Self-Aligned Imprint Lithography ("SAIL"), a recently developed technique for producing multilayer patterns on flexible substrates. The basics of this process are set forth and described in U.S. patent application Ser. No. 10/104,567, US Patent Publication Number 04-0002216, the disclosure of which is incorporated herein by reference.

The SAIL technique uses a 3D patterned resist and is typically employed in roll-to-roll processing. As the 3D resist is flexible, the pattern will stretch or distort to the same degree as the substrate. As such, a SAIL roll-to-roll fabrication process may be employed to provide low cost manufacturing solutions for devices such as flat and/or flexible displays, or other devices suitable for roll-to-roll processing.

Utilizing height differences in an imprinted 3D stamp or other provided 3D structure, multi-level pattern information is provided and self alignment maintained independent of the instability of a flexible substrate. It shall also be realized that the disclosed method may be employed upon a non-flexible substrate while remaining within the spirit and scope of at least one embodiment.

Referring now to the drawings, FIG. 1 through FIG. 18 conceptually illustrate at least one embodiment of providing an active matrix of thin film devices. It will be appreciated that the described process need not be performed in the order in which it is herein described, but that this description is merely exemplary of at least one preferred method of performing a SAIL process with pattern reversal to form an active matrix of thin film devices. In addition, it is understood and appreciated that the scale of the components and features illustrated in the Figures has been exaggerated to facilitate ease of discussion.

FIG. 1 is a high-level flowchart of a method for reversing the pattern in a SAIL process. As indicated in block 100, the processes are generally commenced by providing a substrate. In at least one embodiment, the substrate is flexible. At least one layer of material is deposited upon the substrate, block 102. A pattern is then established upon the layer of material, block 104. The pattern provides at least one exposed area and at least one covered area of the layer of material. As will be further described and explained below, the pattern is physically joined to the layer of material.

As in block 106, the exposed area is treated to provide at least one etch resistant area of material, the covered area remaining susceptible to etching. In at least one embodiment, the property of increasing etch resistance is described as toughening. In other words, in at least one embodiment, the exposed area is treated to provide at least one toughened area of material, the covered area remaining un-toughened. The pattern is then removed, block 108. The layer of material is then etched, block 110, to remove the un-toughened area(s) of material. More specifically, the toughened areas are now substantially more etch resistant than the un-toughened areas, and as such will remain during the etching process.

In block 112 at least one additional material layer is deposited over the remaining toughened material. In block 114 the additional layer or layers are processed in accordance with the desired characteristics of the desired TFD. Such processing generally includes further etching to remove portions of the added material so as to define areas, such as for example, electrodes, areas of isolation, channels, or the like.

Figure 2:
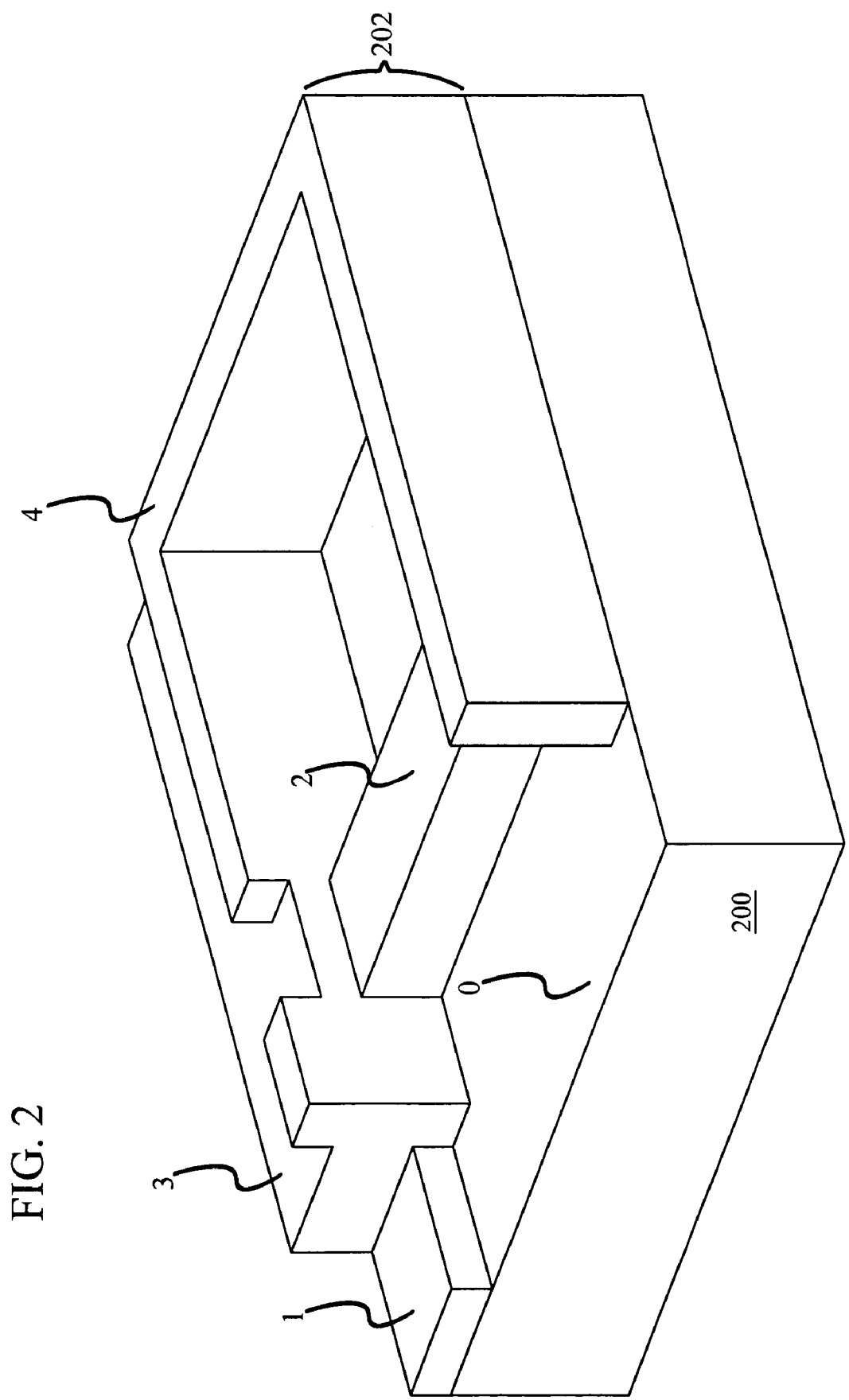
FIG. 2 is a perspective view of a substrate with a 3D structure in accordance with an embodiment.

Turning to FIG. 2, provided is a more detailed illustration of the initial process described above. Specifically, there is shown a portion of a substrate 200. Typically, the substrate 200 is chemically cleaned to remove any particulate matter, organic, ionic, and/or metallic impurities or debris which may be present upon the surface of the substrate 200.

In at least one embodiment, substrate 200 is a flexible substrate, such as, for example, a polyimide plastic sheet with or without an inorganic coating. Further, substrate 200 may be transparent. In at least one alternative embodiment, substrate 200 is both flexible and transparent, such as polyethylene teraphathalate (PET).

A 3D structure 202 is provided upon substrate 200. In at least one embodiment, a polymer, such as an imprint polymer or resist, is deposited upon the substrate 200 and then imprinted by a stamping tool to provide 3D structure 202. In an alternative embodiment, substrate 200 itself may be suitable for imprinting. The resist or polymer may incorporate any of a variety of commercially available polymers. For example, a polymer from the Norland optical adhesives (NOA) family of polymers could be used. A silicone material may also be used as is described in patent application Ser. No. 10/641,213 entitled "A Silicone Elastomer Material for High-Resolution Lithography" which is herein incorporated by reference.

A method for utilizing a stamping tool to generate a 3D Structure in a layer of material is described in patent application Ser. No. 10/184,587 entitled "A Method and System for Forming a Semiconductor Device" which is herein incorporated by reference. A stamping tool is further described in patent application Ser. No. 10/903,300 entitled "Imprint Stamp" which is herein incorporated by reference. With further respect to roll-to-roll processing where substrate 200 may be of arbitrary size, yet another method for providing a 3D Structure is described in U.S. Pat. No. 6,808,646 entitled "Method of Replicating a High Resolution Three-Dimension Imprint Pattern on a Compliant Media of Arbitrary Size" which is also herein incorporated by reference.

For purposes of discussion, the fabrication of an active matrix of bottom-gate thin film transistors (TFTs) will be used as an example. Specifically an enlarged portion of the array depicting a single TFT will be illustrated with associated crossing control conductors. It is, of course, understood and appreciated that the pattern reversal process is not limited to the fabrication of bottom-gate TFTs, but may be employed in a variety of different fabrication settings.

Generally speaking, when employing a stamp and polymer, a stamping tool is brought into contact with the polymer, thereby displacing the polymer layer into the 3D pattern provided by the stamping tool. Typically, the displaced polymer is then cured, such as by UV light exposure, or any other suitable curing means. As shown, in at least one embodiment, 3D structure provides five levels of substantially different vertical heights, levels 0, 1, 2, 3 and 4. The source and drain electrodes will ultimately be defined in part by level 0 and the gate electrode will be defined by level 2. Levels 0, 1 and 3 facilitate the establishment of crossing conductors to control the eventual gate electrode and source or drain (depending on configuration) for the specific selection of a given TFT within the array. Level 4 serves in part to provide device isolation.

Figure 3:
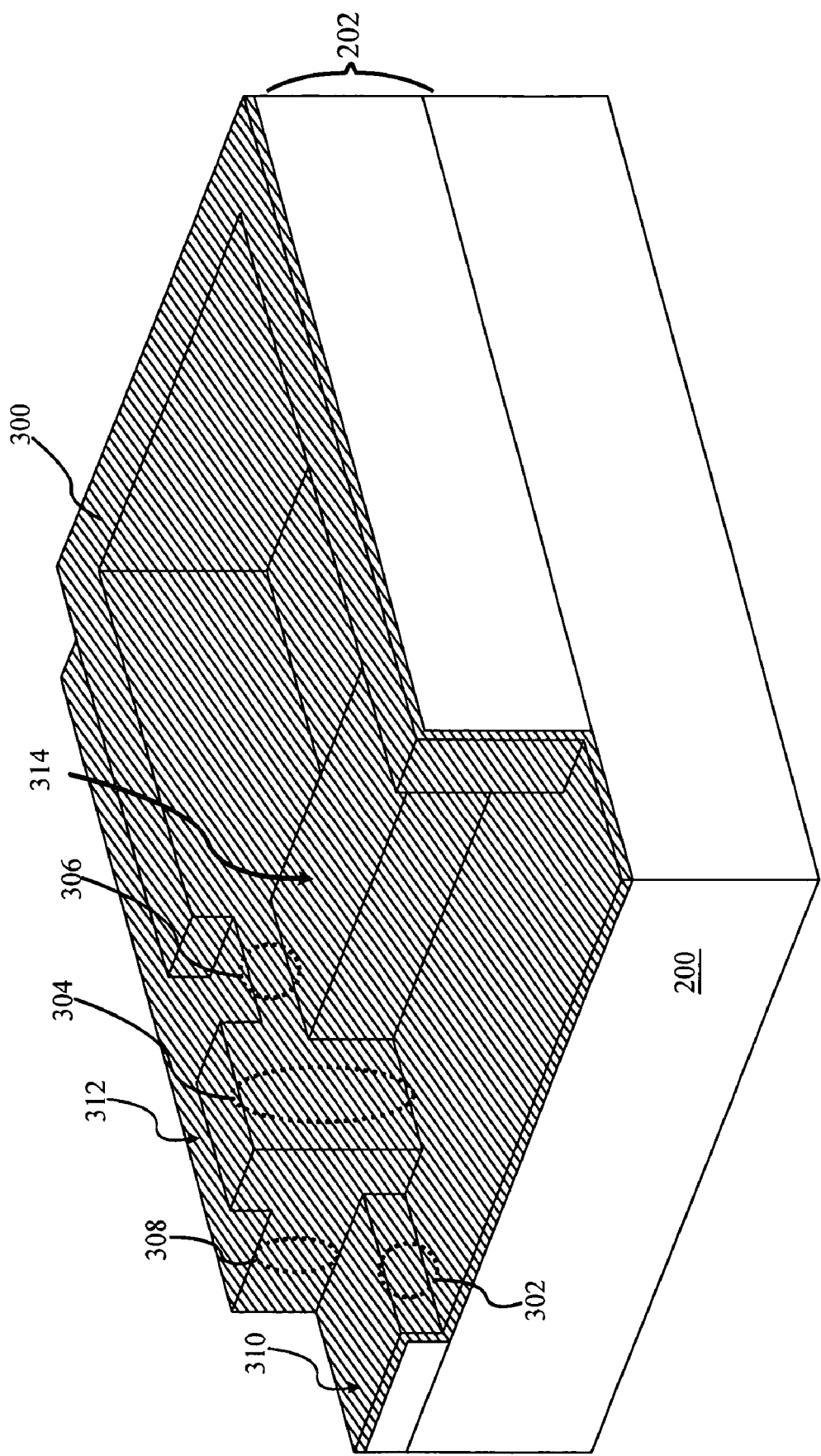
FIG. 3 is a perspective view of a layer of material deposited upon the 3D structure in accordance with an embodiment.

As shown in FIG. 3, a layer of material 300 is deposited upon a flexible substrate 200 and, more specifically, in the embodiment shown, upon the 3D structure 202. Deposition of the layer of material 300 may be done by vacuum deposition, gravure coating, sputtering, roll-to-roll deposition equipment, spin casting, ion beam deposition, electron beam evaporation, metal organic deposition (MOD), chemical vapor deposition (CVD) or such other method as is appropriate for the material being deposited. In at least one embodiment, layer of material 300 includes chrome (Cr).

It is understood and appreciated that layer of material 300 is deposited uniformly upon substrate 200. Further, substantially vertical sidewall areas, such as sidewalls 302, 304, 306 and 308 receive a deposition that is thinner then non-vertical areas, such as non-vertical areas 310, 312 and 314. The vertical sidewall 302, 304, 306 and 308 are sufficiently thick so as to conduct current continuously from one level to the next. For ease of discussion and illustration, the thickness has been exaggerated in sidewalls 302-308. In at least one embodiment, where sidewalls are desired to remain, such as for example sidewalls 306 and 308, the sidewalls may be slanted.

Figure 4:
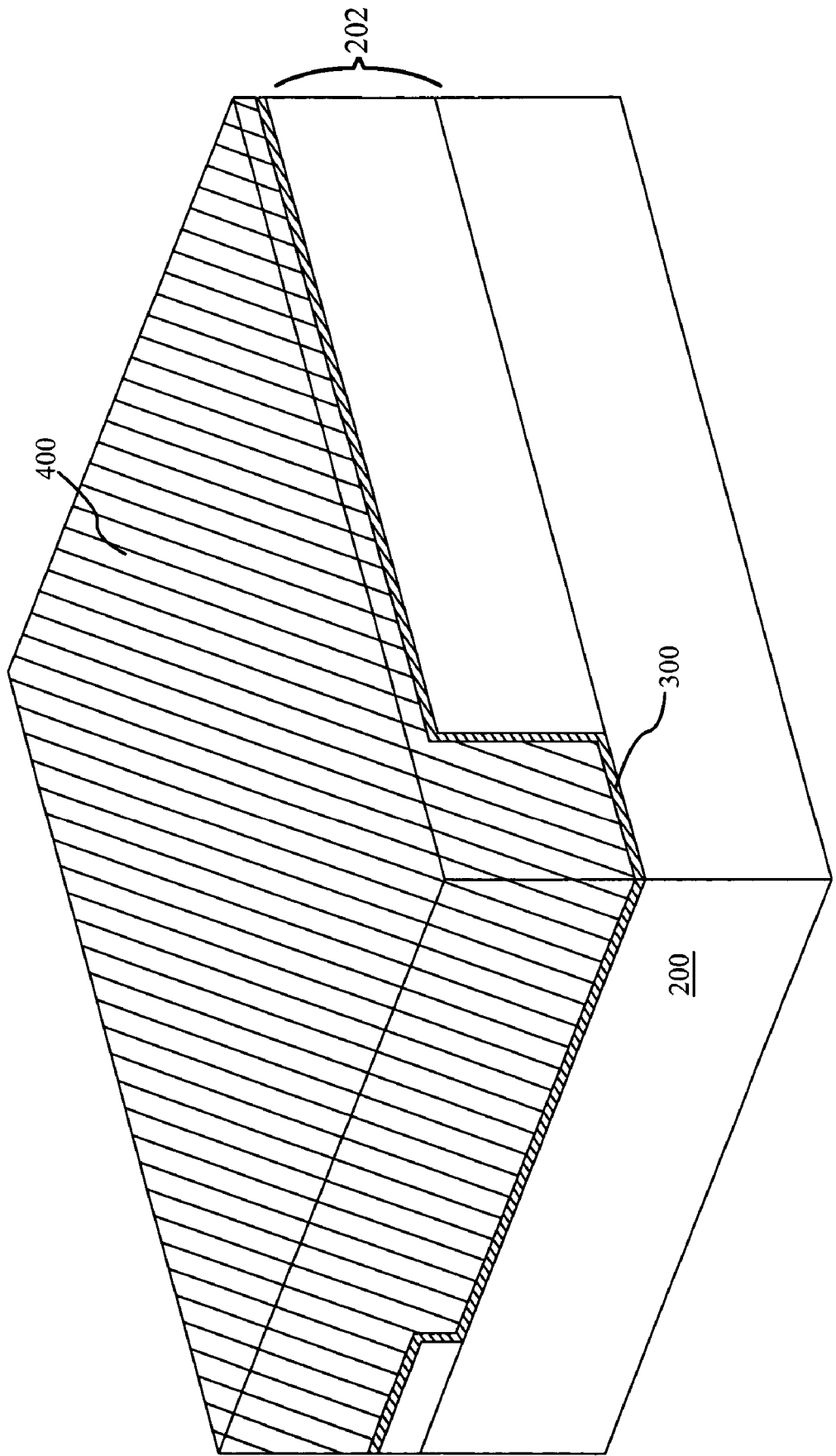
FIG. 4 is a perspective view of a polymer deposited over the layer of material in accordance with an embodiment.

A material 400 such as a polymer or spin-on-glass (SOG) is then deposited over layer of material 300 and 3D structure 202 by an appropriate deposition method, see FIG. 4. As shown in FIG. 4, material 400 is then planarized to form a uniform surface, illustrated as being flat. In at least one embodiment, the planarization is accomplished via a chemical-mechanical polishing (CMP) process.

In a typical CMP process, the top layer is exposed to an abrasive medium under controlled chemical, pressure, velocity and temperature conditions. Abrasive media include slurry solutions and polishing pads. In another embodiment, the planarization is accomplished by a gravure coating process. The gravure coating process relies on an engraved roller running in a coating bath, which fills the engraved dots or lines of the roller with a coating precursor material. The excess coating on the roller is wiped off by a doctor blade and the coating is then deposited onto the layer of material 300 as it passes between the engraved roller and a pressure roller. The coated material is then cured and forms a flat surface above layer of material 300.

Figure 5:
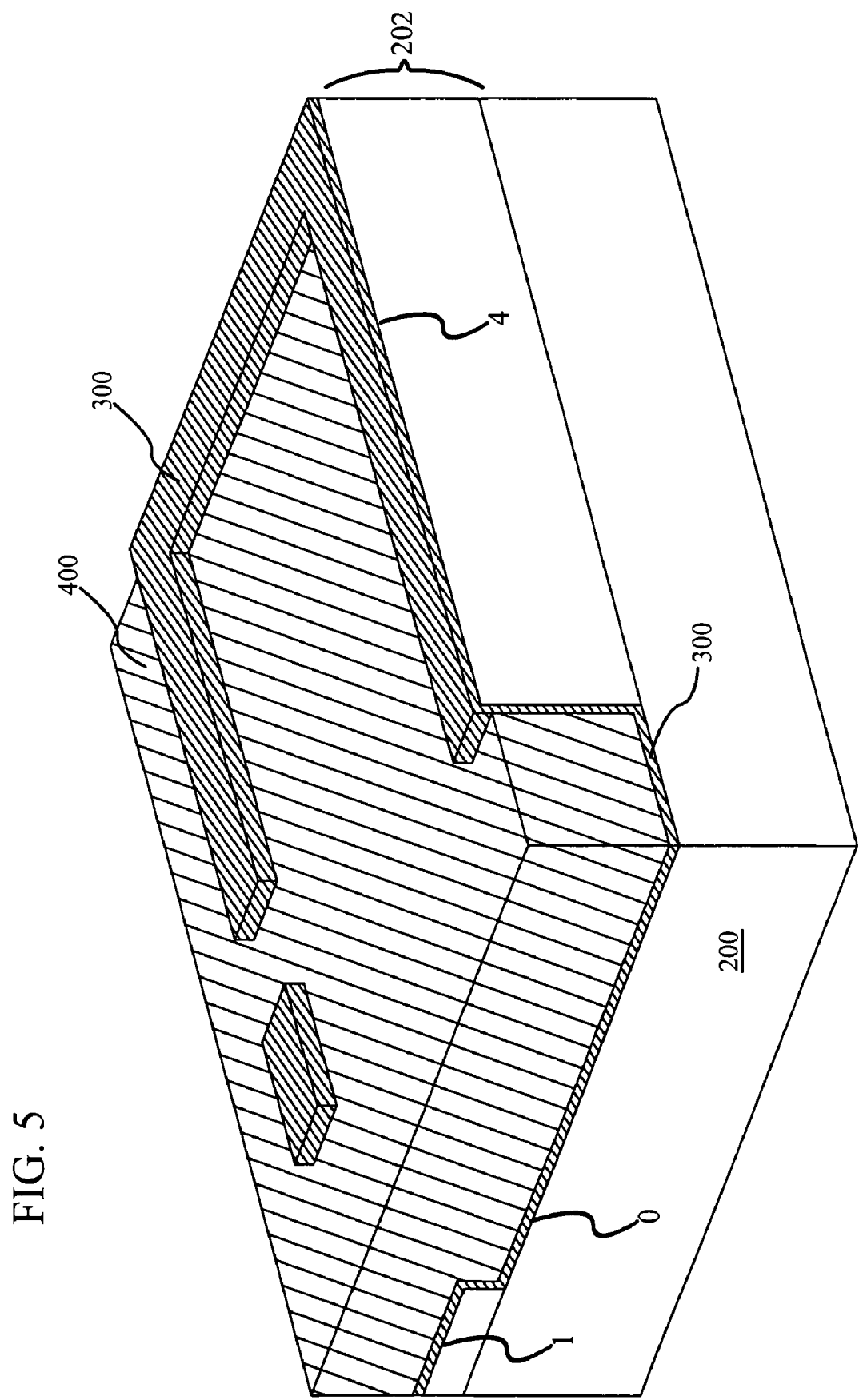
FIG. 5 is a perspective view of the polymer height reduced to show the a portion of the layer of material in accordance with an embodiment.

As shown in FIG. 5, material 400 is then etched down to expose the upper-most portions of layer of material 300, specifically layer of material 300 at level 4. The etching can be accomplished by a reactive ion etching process (RIE).

It is generally understood that an ion etching process may be accomplished by either of two traditional processes—a physical process or an assisted physical process. In a physical etching environment, no chemical agent is provided. Rather, the removal of material is entirely dependent upon the physical impact of the ions knocking atoms off the material surface by physical force alone. Physical ion etching is commonly referred to as ion milling or ion beam etching. Physical ion etching is also typically referred to as a dry process. A physical etching process is typically very anisotropic.

In an assisted physical process such as a reactive ion etching process, or RIE, removal of material comes as a combined result of chemical reactions and physical impact. Generally, the ions are accelerated by a voltage applied in a vacuum. The effect of their impact is aided by the introduction of a chemical which reacts with the surface being etched. In other words, the reaction attacks and removes the exposed surface layers of the material being etched.

The reactive ion etching process may have a high selectivity of etching one material over other materials. For example, oxygen plasma may have a high etch selectivity of polymer over silicon or metal materials. In other words, an RIE process advantageously permits accurate etching of one or more material layers with little appreciable effect upon other material layers. The layer of material 300 at level 4 may also be exposed in an ion etching process more fully described with respect to FIG. 6.

Figure 6:
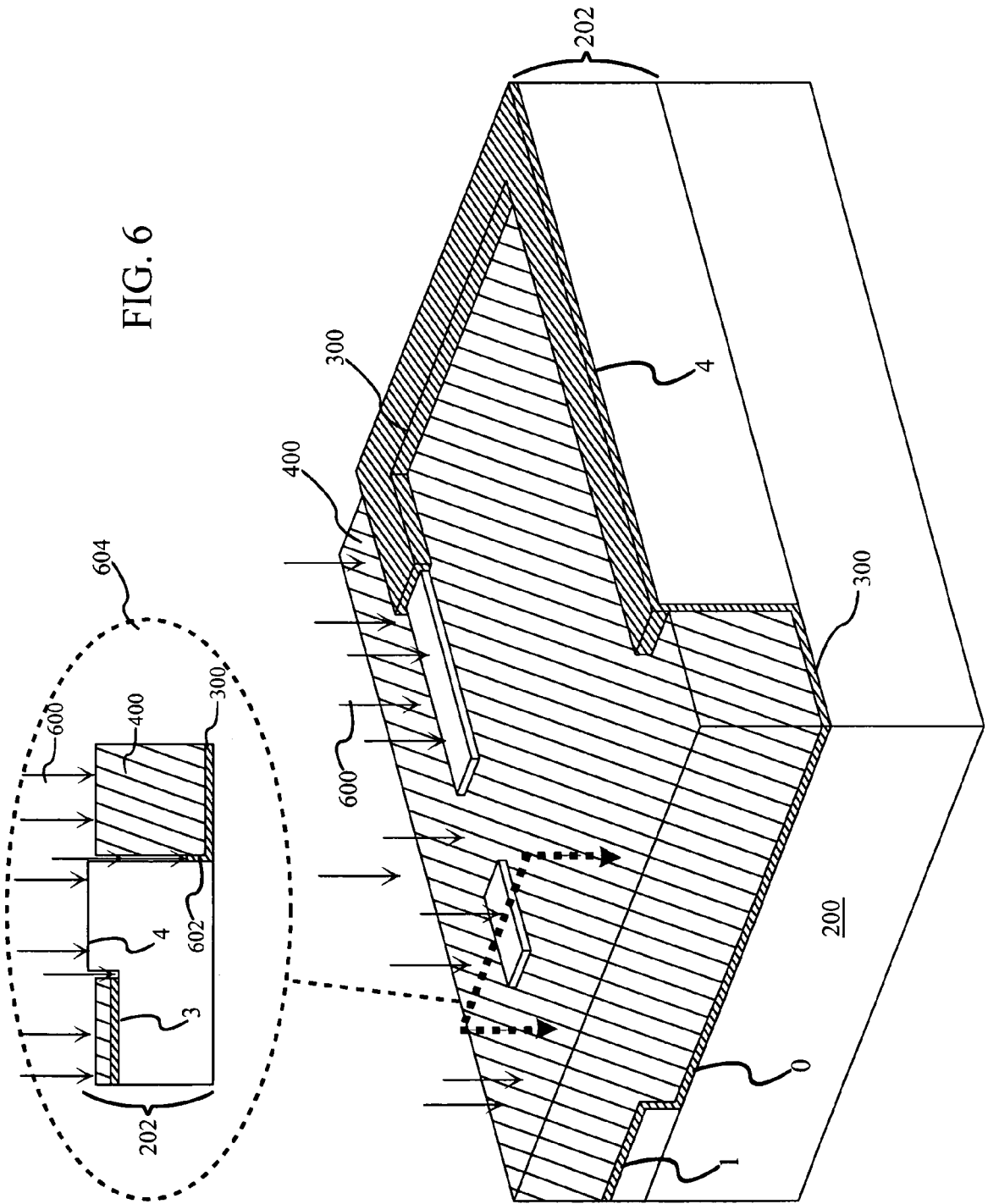
FIG. 6 is a perspective view is a perspective view of the etching process removing the exposed portion of the layer of material in accordance with an embodiment.

FIG. 6 illustrates the removal of layer of material 300 from level 4. In at least one embodiment, this removal is accomplished by ion-etching. As shown by arrows 600, the etching process is applied across the surface to remove exposed portions of layer of material 300. Preferably, the etching process is an over-etching process, such that, in addition to removing the exposed layer of material from level 4, the sidewalls 602 of the exposed portions of layer of material 300 are also substantially reduced. Such over-etching and sidewall removal may be further appreciated in the partial cross section view bounded by dotted line 604.

This type of RIE process may be used in at least one embodiment to reduce material 400 and expose layer of material 300 at level 4 before the layer of material 300 at level 4 itself is etched. In at least one embodiment, RIE may be preferred as it permits the level of the material 400 to be dropped so as to be between level 4 and level 3, so as to further expose and facilitate removal of sidewalls 602.

In at least one embodiment, the removal or etching of layer of material 300 exposed at level 2 is accomplished with RIE. Although ion etching and RIE have been described in conjunction with at least one embodiment, it is understood and appreciated that one of ordinary skill in the art will recognize that a variety of different etch processes could be utilized without departing from the scope and spirit herein disclosed.

Figure 7:
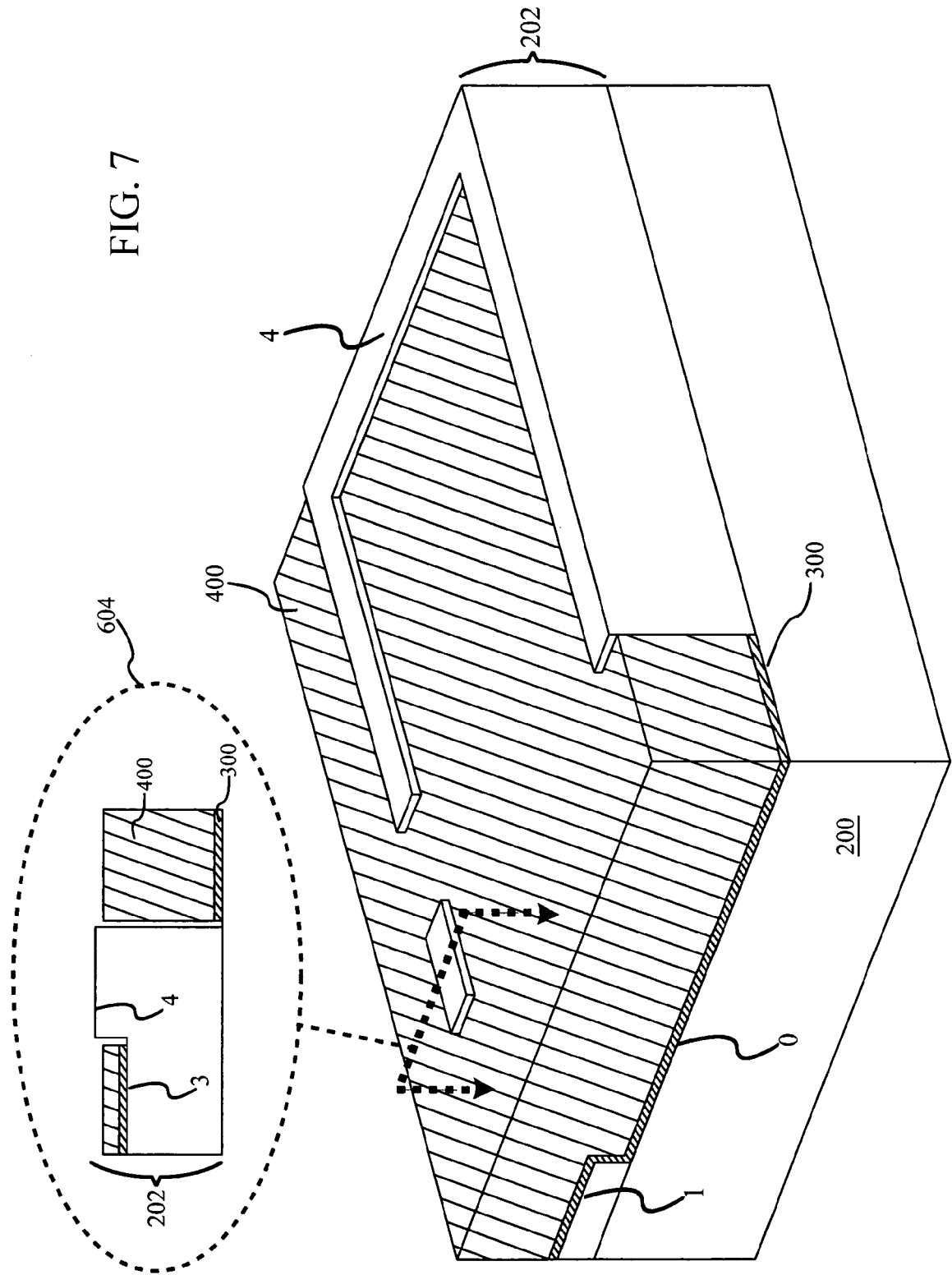
FIG. 7 is a perspective view following the etching process in accordance with an embodiment.

In another embodiment, the removal or etching of layer of material 300 exposed at level 4 is accomplished with a wet chemical etch process. For example, the exposed Cr layer can be etched in a Cr etchant such as CR-7S made by Cyantek. FIG. 7 illustrates the state following the RIE process to remove all exposed layer of material 300 at level 4 and exposed sidewalls 602. Level 4 of 3D structure 202 is now exposed.

Figure 8:
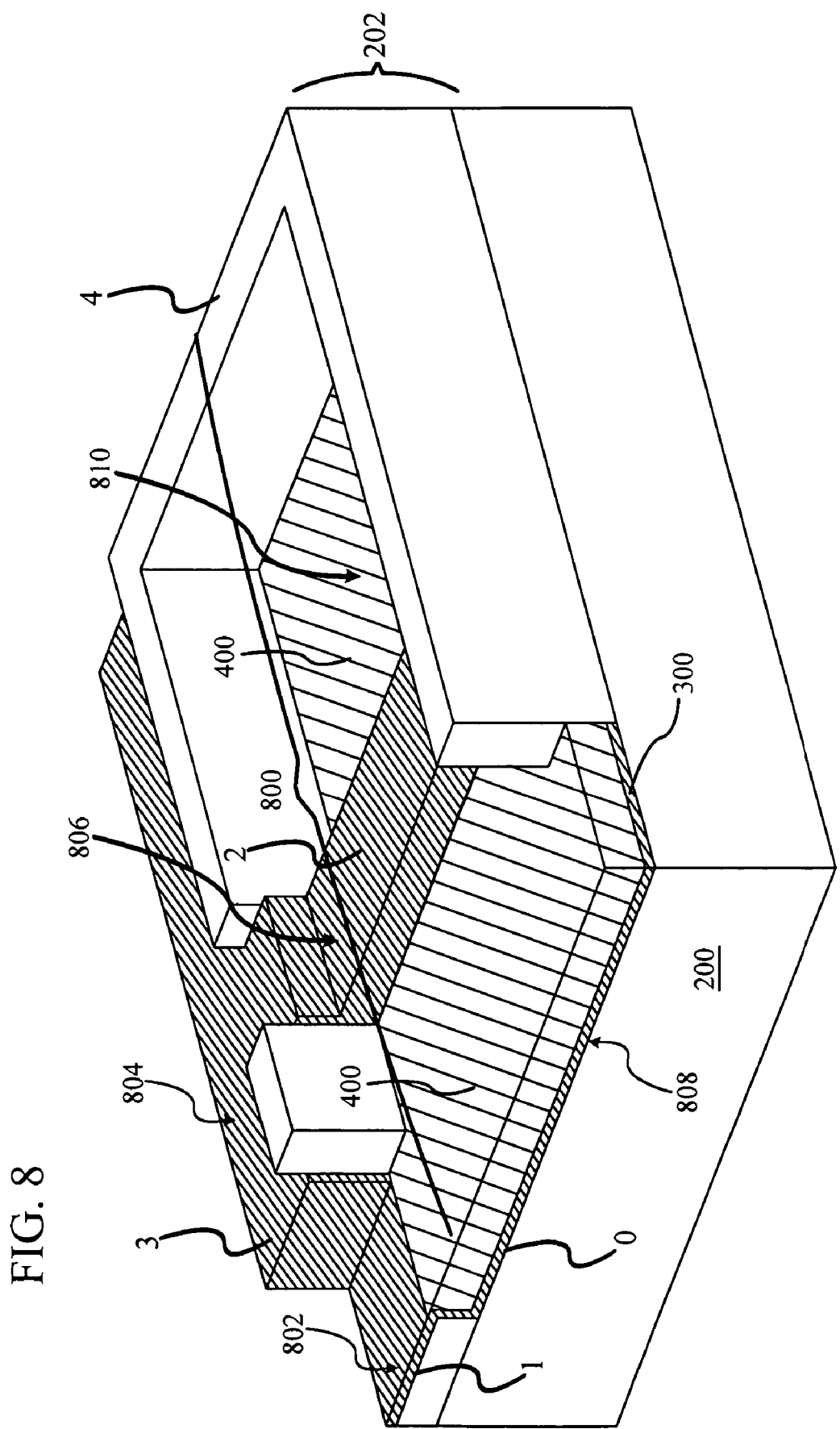
FIG. 8 is a perspective view of the polymer height reduced to establish a pattern in accordance with an embodiment.

Etching, specifically RIE, is then further performed upon material 400 to expose layer of material 300 at levels 1, 2 and 3, shown in FIG. 8. Material 400 still covers layer of material 300 at level 0. As indicated above, the layer of material 300 at level 2 will ultimately provide the gate electrode in the example embodiment herein described. The layer of material at levels 1 and 3 will ultimately provide the gate control line.

To provide such a gate electrode, and reduce the occurrence of parasitic capacitance between the gate, source and drain, it is generally necessary to remove the layer of material 300 from level 0 so as to reduce the occurrence of overlap between the source/drain and gate electrodes. To accomplish this removal with advantageous precision, the pattern is reversed so that what shows stays.

FIG. 8 illustrates a pattern 800 provided by material 400, providing exposed areas 802, 804, and 806 and covered areas 808 and 810. Typically areas of material exposed are removed, while areas of material that are covered are not removed. Pattern 800 providing exposed areas 802-806 and covered areas 808, 810 is utilized to enhance the etch resistance properties of the exposed material. In other words, the exposed areas 802-806 are toughened (i.e. made more resilient and able to withstand strain and wear without eroding or breaking) while the un-exposed areas 808, 810 remain etch susceptible as they remain un-toughened. To state it most simply, pattern 800 is reversed. As used herein, the term "toughened" is understood and appreciated to include the properties of being etch resistant, and/or having enhanced etch resistance.

Figure 9:
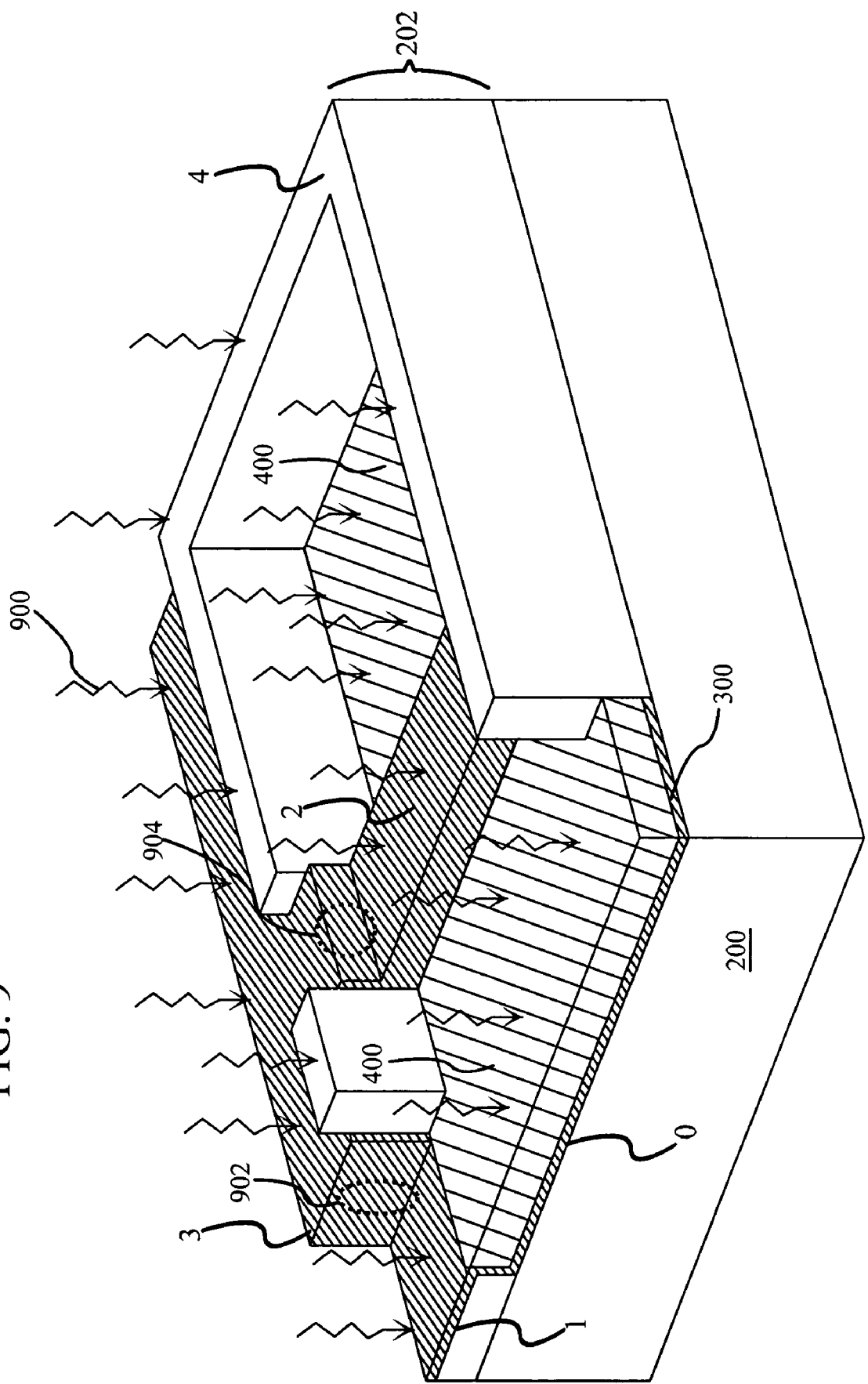
FIG. 9 is a perspective view of the treatment performed upon the exposed portions of the layer of material as defined by the pattern in accordance with an embodiment.
Figure 10:
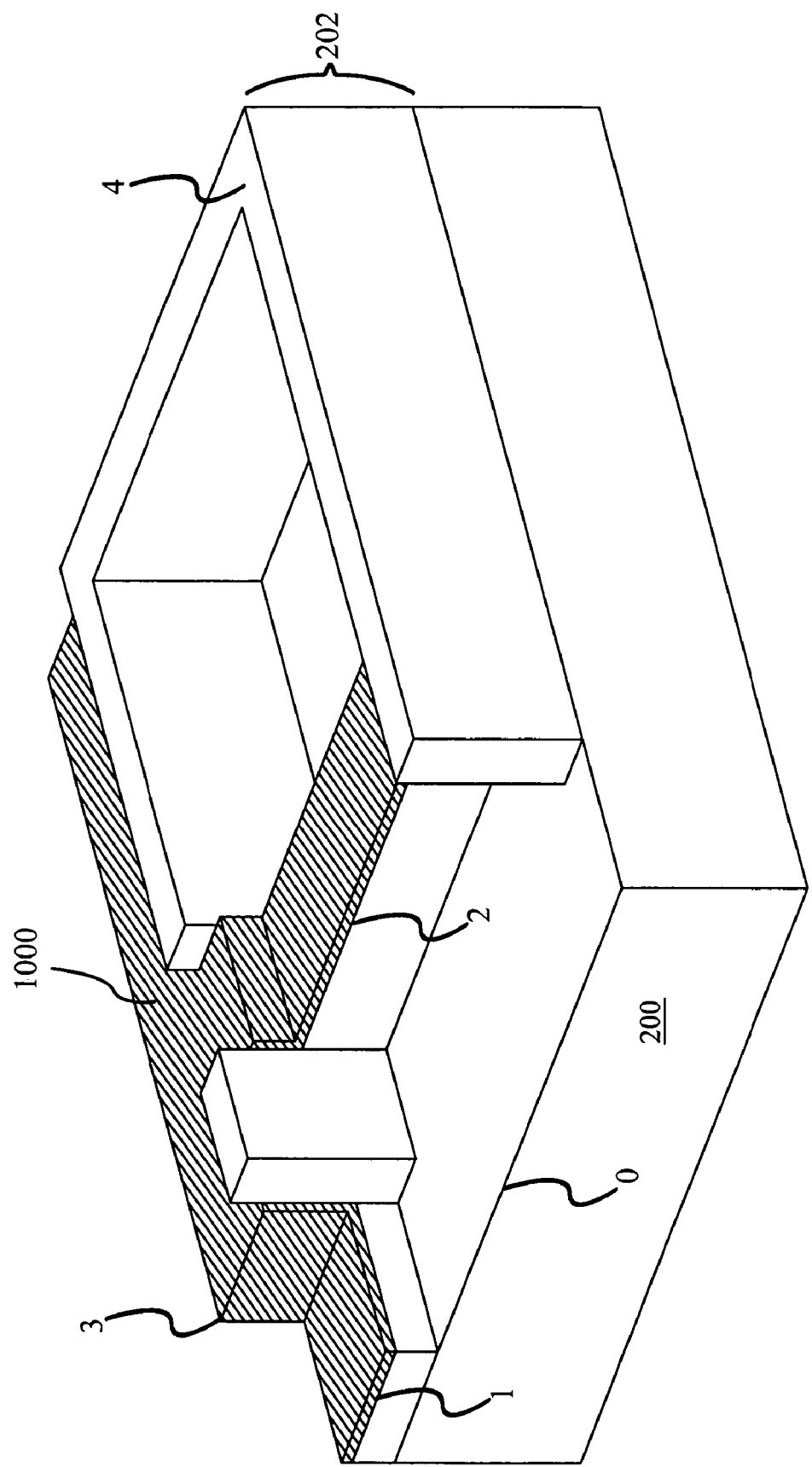
FIG. 10 is a perspective view of the remaining toughened material following removal of the polymer and subsequent etching in accordance with an embodiment.
Figure 11:
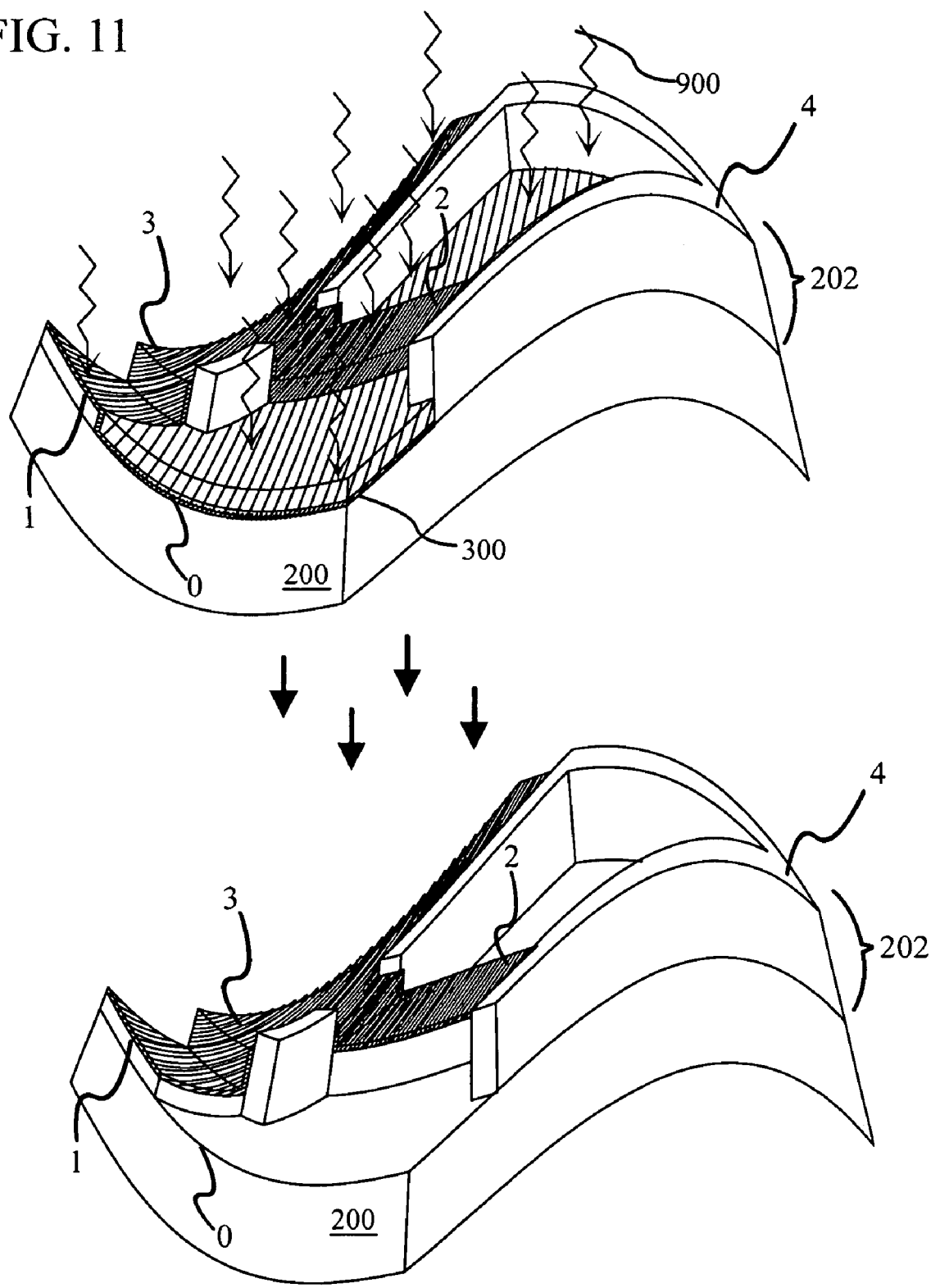
FIG. 11 is a perspective view illustrating the flexible alignment properties of the pattern reversal process in accordance with an embodiment.

FIGS. 9 through 11 illustrate the process and result of this pattern reversal. As shown in FIG. 9, substrate 200 is treated, indicated by arrows 900, so as to provide etch resistance, or enhanced etch resistance to the layer of material 300 in exposed areas 802, 804, 806. Moreover, in at least one embodiment, the substrate 200 is treated to toughen the layer of material 300 in exposed areas 802, 804, 806. Such toughening treatment may be accomplished by a variety of different methods, such as, but not limited to, electroforming, photo interaction, ion implantation, plasma treatment and combinations thereof. Other methods of providing etch resistant properties or enhanced etch resistance properties may also be employed.

With respect to the specific methods listed, electroforming is understood and appreciated to be similar to plating. For example, where the layer of material 300 is chrome, the exposed chrome will act to seed the growth of nickel or other metal. This additional metal enhances the area that will form the gate electrode and gate control line and provides etch resistant toughness to the exposed chrome (e.g., exposed areas 802, 804, 806).

When photo interaction is employed, there are actually two thin film layers involved, such as, for example, a chrome layer with a photoresist disposed on top. The pattern 800 therefore exposes the stacked chrome and photoresist. Exposure to a light source, such as an ultra-violet light source, will harden the exposed photoresist, and thus provide toughened protection to the chrome directly beneath (e.g., exposed areas 802, 804, 806). It is of course understood and appreciated that this added layer of photoresist is different from material 400 (which may be a resist). In addition, so as to react to UV light, when such a layer of photoresist is incorporated, it is an active photoresist. Unexposed photoresist remains un-hardened and as such provides no toughened protection to the chrome directly beneath (e.g. un-exposed areas 808, 810). Although similar to a traditional photolithographic process, this embodied process is advantageously distinguished as no separate mask is employed requiring separate alignment.

Ion implantation is well know and frequently employed in doping layers. Typically, the layer of material 300 is subjected to an ion source in a vacuum. For doping, a proper ion energy is used to introduce dopants in exposed areas 802, 804, 806. In the embodiment described, introducing dopants toughens the layer of material 300. The introduction of dopants to toughen the layer of material 300 may be accomplished with an ion energy greater than would be appropriate for traditional doping (i.e., without imparting a toughening quality).

Plasma treatment involves creating a vacuum about layer of material 300 and subjecting layer of material 300 to a plasma gas such as, for example, $SF_6$ or $CHF_3$. In at least one embodiment, the plasma gas is $CHF_3$. The plasma gas induces a surface protection for the layer of material 300, resulting in toughness. Typically, 100 sccm $CHF_3$ with operation pressure of 100 mTorr is applied. The plasma power is about 100 W. These conditions are for a particular plasma system. An optimum condition may vary depending on a specific plasma system. In at least one embodiment, the toughening process performed upon exposed areas 802, 804, 806 is by plasma treatment.

In at least one embodiment, following the toughening process, pattern 800 (the remaining material 400) is removed and the layer of material 300 is etched. The etching of layer of material 300 may be by substantially the same type of RIE process or wet chemical process described above to remove the layer of material 300 from level 4. More specifically, the same etching process is performed on un-toughened material in previously covered areas 808, 810 and toughened material in exposed areas 802, 804, 806.

It is realized that any remaining sidewall 602 portions of layer of material 300 adjacent to the exposed area 806 at level 2 may also have been partially toughened contemporaneously with the layer of material 300 exposed at levels 1, 2 and 3. However, the sidewalls 602 are of such thinness that any toughening provided (such as to an exposed end) is inconsequential and the etching process is capable of removing them. In contrast, the exposed sidewalls 902, 904 enjoy full exposure to the toughening process 900, and will remain.

As shown in FIG. 10, the pattern has been reversed such that a layer of only toughened material 1000 now exists in the intended locations of level 1, 2 and 3. In the example illustrated, this provides a gate electrode. In the case of $CHF_3$ treatment, the original material properties of layer of material 300 can now be substantially recovered by oxygen plasma treatment in order to ensure a proper conductance for the gate electrode. FIG. 11 illustrates the highly advantageous nature of the SAIL process and the pattern reversal process to effectively provide alignment without respect to distortions in substrate 200 and/or 3D structure 202.

More specifically, FIG. 11 illustrates the toughening process (indicated by arrows 900) being performed when substrate 200 and 3D structure 202 are distorted. As shown, irrespective of the physical distortion experienced by substrate 200, 3D structure 202 and layer of material 300, the alignment of pattern reversal remains unaffected and the desired gate electrode is provided.

Traditional lithographic processes, such as photolithography involving the deposition of a layer, subsequent 2-D masking and etching, cannot tolerate substrate distortion without undermining the functionality of the intended device. In addition, the pattern reversal process advantageously provides precise distortion-tolerant alignment without requiring additional processing steps.

Moreover, the pattern reversal process for SAIL is performed in at least one embodiment as a roll-to-roll process, also referred to as web processing. In roll-to-roll processing, the substrate 200 (and resulting layered structure) may be several meters wide and several meters long. Roll-to-roll processing is therefore an advantageous method when fabricating large devices such as backplanes for video displays.

Although illustrated as reversing the pattern upon layer of material 300 adjacent to substrate 200 and/or 3D structure 202, it is understood and appreciated that the pattern reversal process may be performed upon mid-level layers stacked above substrate 200 and/or 3D structure 202. In addition, the toughening process provides a tough but not brittle quality to toughened material 1000, such that it remains flexible and is advantageously able to conform to distortions as well.

In at least one embodiment the toughening or etch resistant properties may also be reversed or removed prior to the deposition of additional materials, such as for example thin film layers. For example, where electroforming is performed to add a covering of nickel to the chrome, the nickel may be removed. Likewise in a photo interaction process incorporating the use of a photoresist, the protecting areas of photoresist are generally removed.

As etch resistant properties, or toughness is typically at issue only for the purposes of reversing the pattern, subsequent reversal or removal of these properties does not diminish the advantageous nature of this process. Indeed, although referred to as etch resistant areas or toughened material 1000 in FIGS. 10 through 18, this material may in actuality have etch susceptibility substantially equivalent to the original untreated layer of material 300. So as to help distinguish before and after states in the pattern reversal process it is identified the following description and figures as if the etch resistant (i.e. toughness) properties remain.

Figure 12:
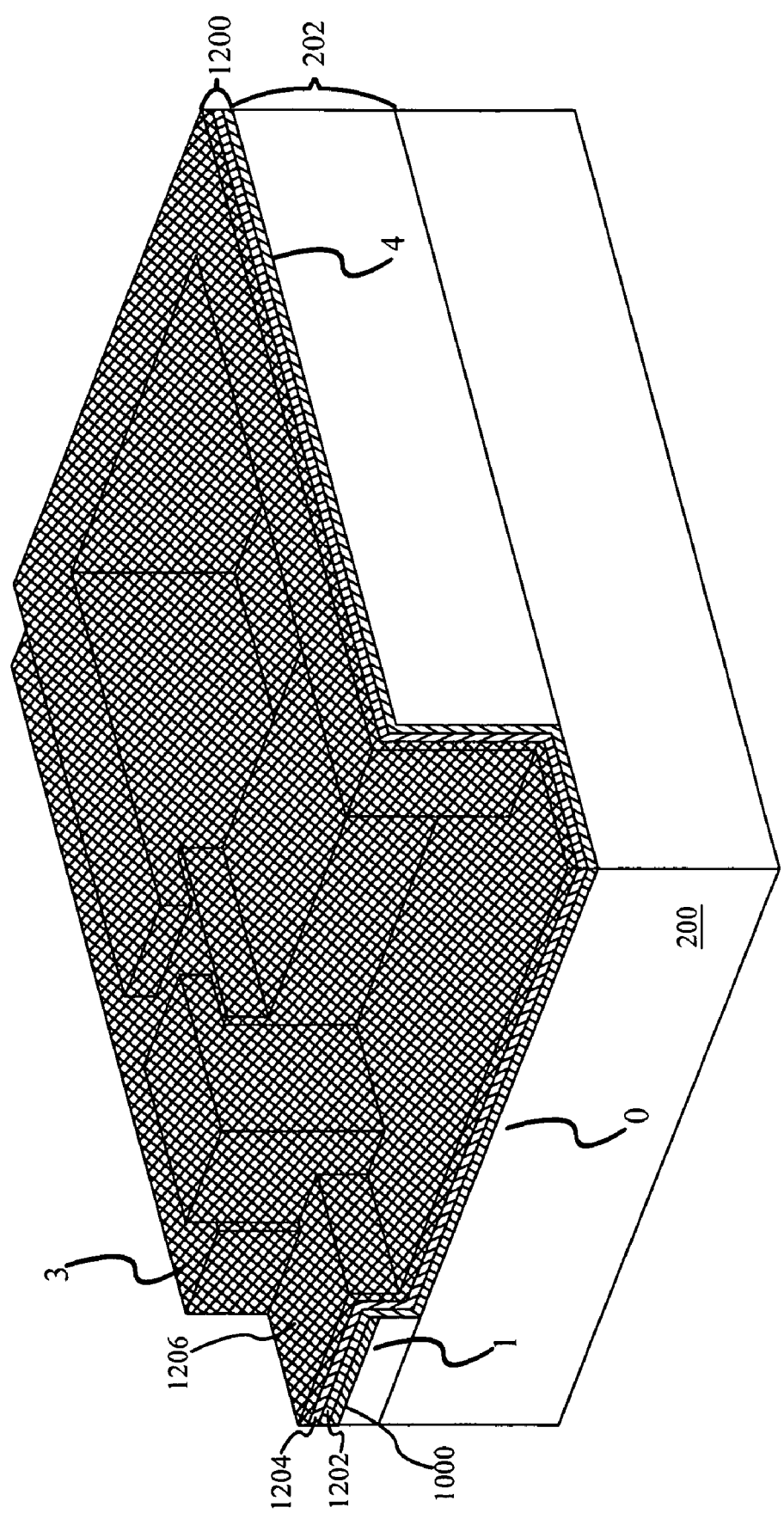
FIG. 12 is a perspective view illustrating the subsequent deposition of thin film layers upon the substrate and toughened material in accordance with an embodiment.

As shown in FIG. 12, a plurality of thin film layers are deposited upon the substrate 200 and toughened material 1000 (gate electrode and gate control line) as a stack of thin film layers 1200. The process of deposition is a matter of fabrication preference with respect to the materials being deposited.

In at least one embodiment, the thin film layers 1200 include a dielectric layer 1202, a semiconductor layer 1204 and a top metal layer 1206. Under appropriate circumstances, a contact layer may also be deposited so as to lay between the semiconductor layer 1204 and the top metal layer 1206.

In at least one embodiment, the stack of thin film layers 1200 is a stack of Silicon Nitride, Amorphous Silicon, N+ doped microcrystalline or amorphous Silicon and Aluminum. In embodiments where substrate 200 is transparent, and the resulting device is intended to be transparent or semi-transparent as well, transparent conductive materials such as Indium Tin Oxide may be used. Other transparent conductive and semiconductor materials may also be used, such as, for example, ZnO as well as certain organic and doped semiconductor materials. Transparent dielectrics such as, for example, SiN or $AL_2O_3$ may also be used.

Figure 13:
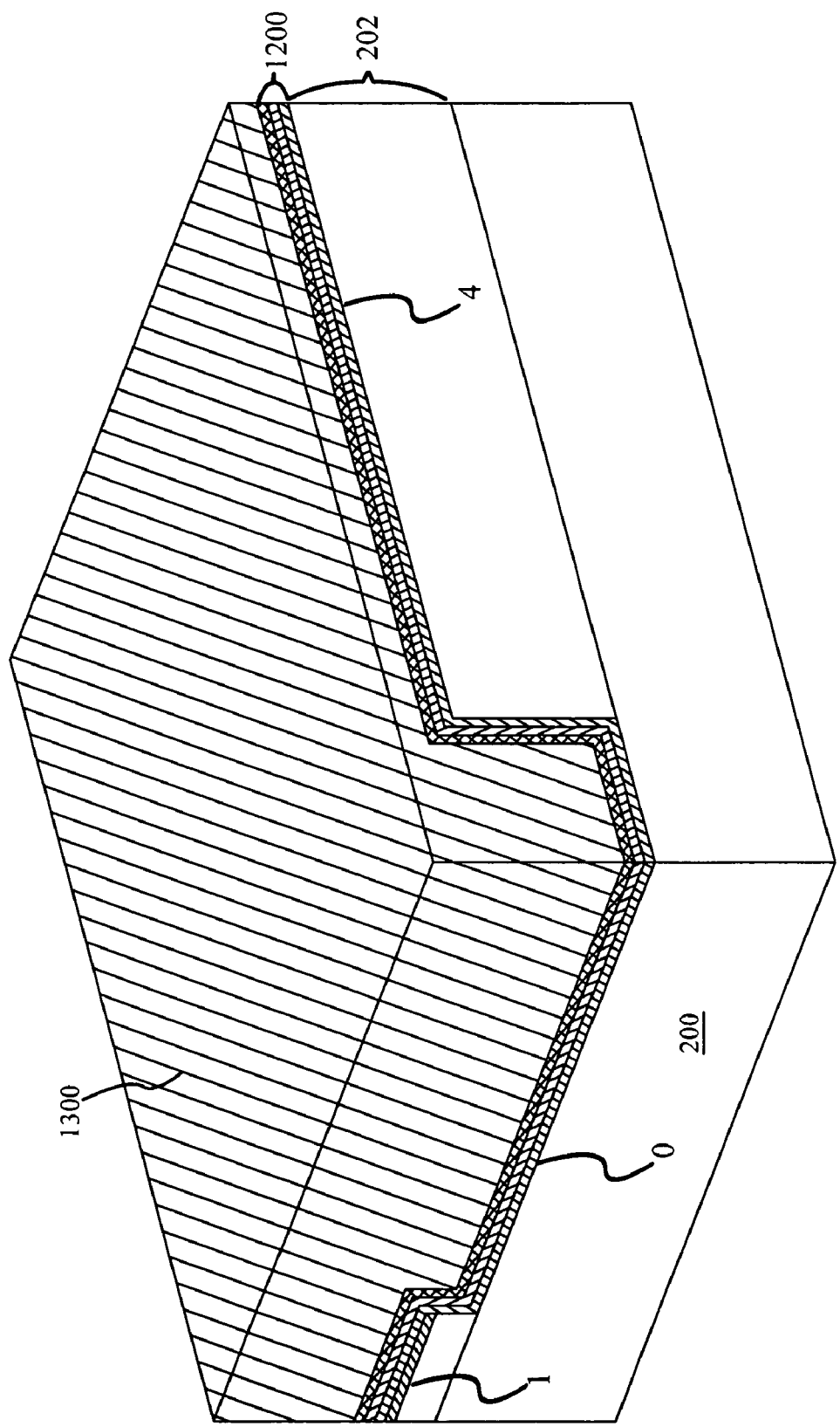
FIG. 13 is a perspective view illustrating the deposition of a polymer over the thin film layers.
Figure 14:
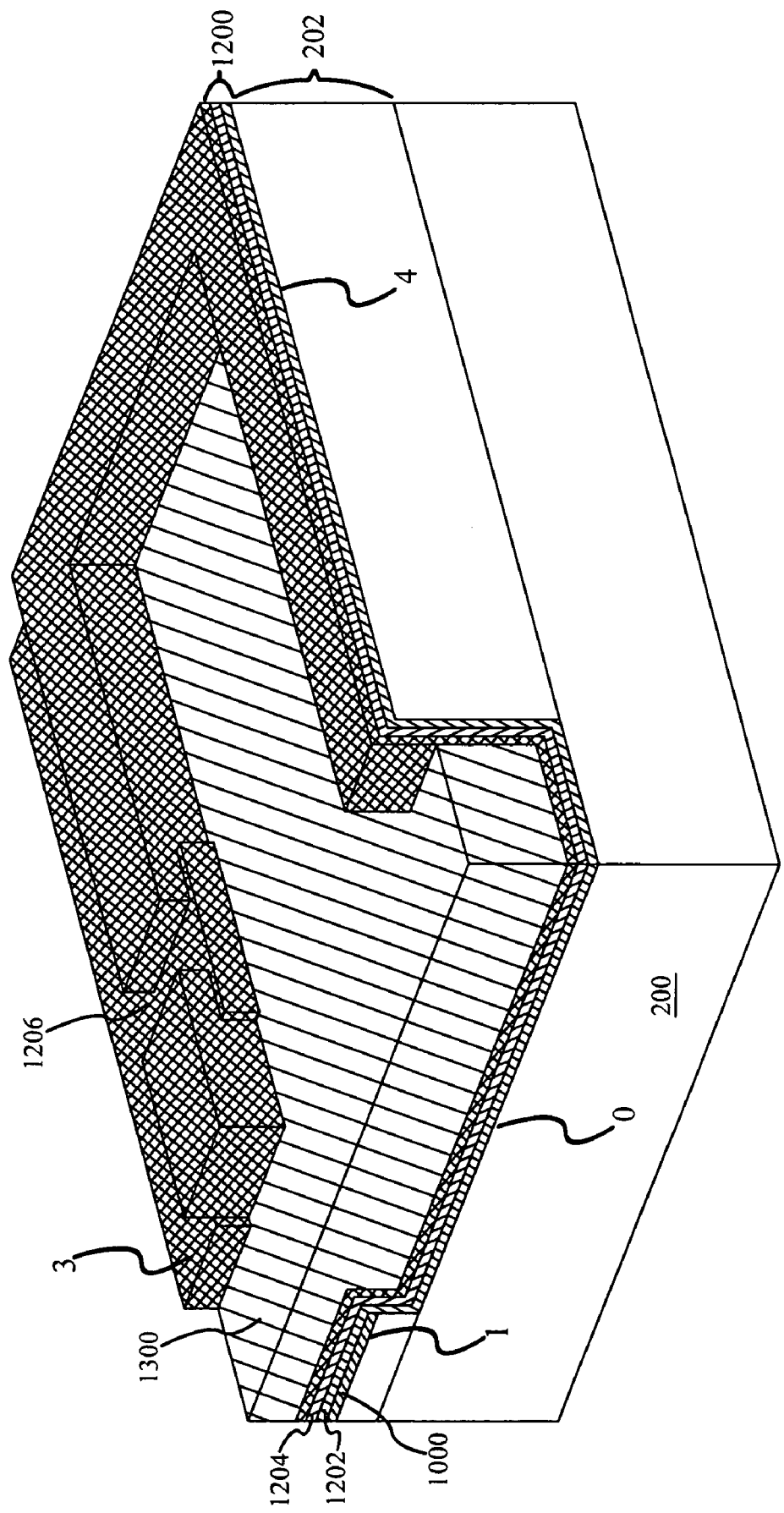
FIG. 14 is a perspective view of the polymer height being reduced to expose the top portions of the thin film stack.

In FIG. 13, a polymer 1300 is deposited over the thin film layers 1200. In at least one embodiment, polymer 1300 may be the same type of material used and described above with respect to material 400 in FIG. 4. Polymer 1300 is then planarized and/or etched to expose the thin film layers 1200 at levels 3 and 4, see FIG. 14.

As with FIG. 6 above, the exposed thin film layers 1200 at levels 3 and are etched to remove the exposed portions of top metal layer 1206 and then the subsequently exposed portions of the semiconductor layer 1204. Again, the etching processes are preferably performed as over-etching processes, so as to substantially remove the sidewalls (not shown) of the top metal layer 1206 and the semiconductor layer 1204 rising vertically from levels 0, 1 and 2.

Figure 15:
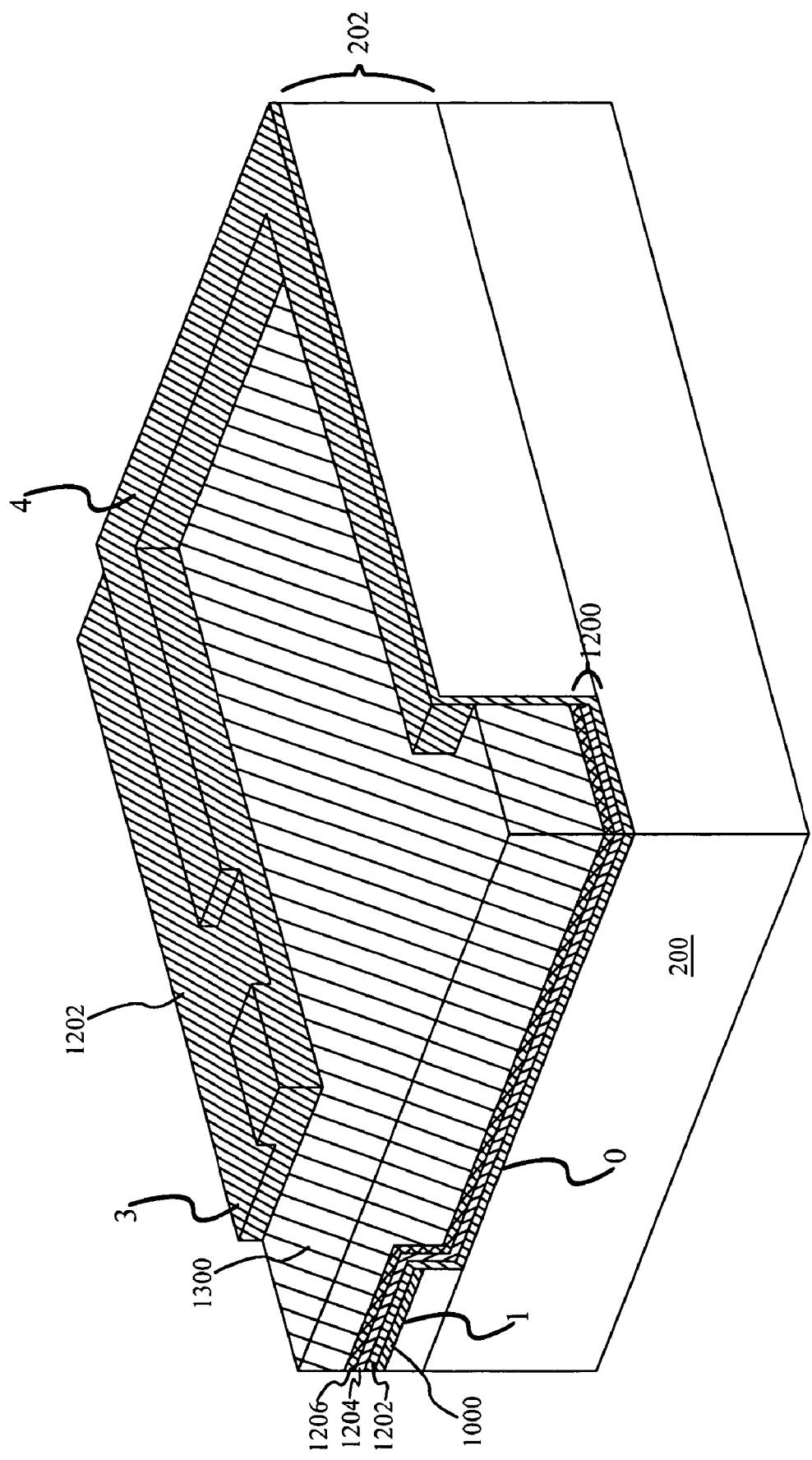
FIG. 15 is a perspective view of a remaining thin film layer after etching is performed to remove other exposed thin film layers.
Figure 16:
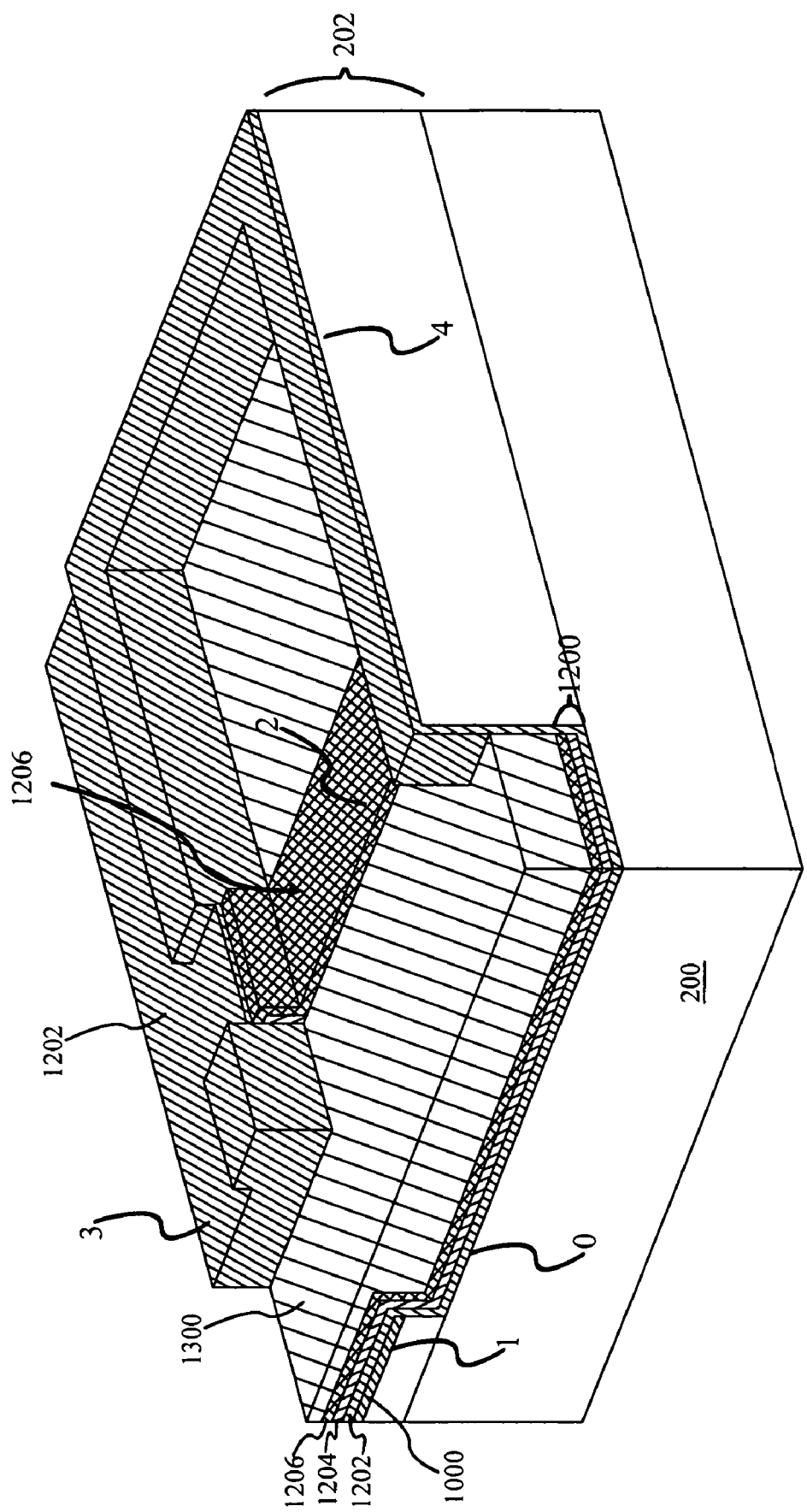
FIG. 16 is a perspective view of the polymer height reduced to expose an area of the device that will form the channel.

FIG. 15 illustrates the structure following the etching process to remove the exposed top metal layer 1206 and semiconductor layer 1204 from levels 3 and 4. As shown, the dielectric layer 1202 is now exposed at levels 3 and 4. The height of polymer 1300 is then lowered by appropriate etching or other removal process so as to expose top metal layer 1206, at level 2, see FIG. 16. The exposed section of top metal layer 1206 at level 2 is vertically in line with toughened material 1000 forming the gate electrode.

Figure 17:
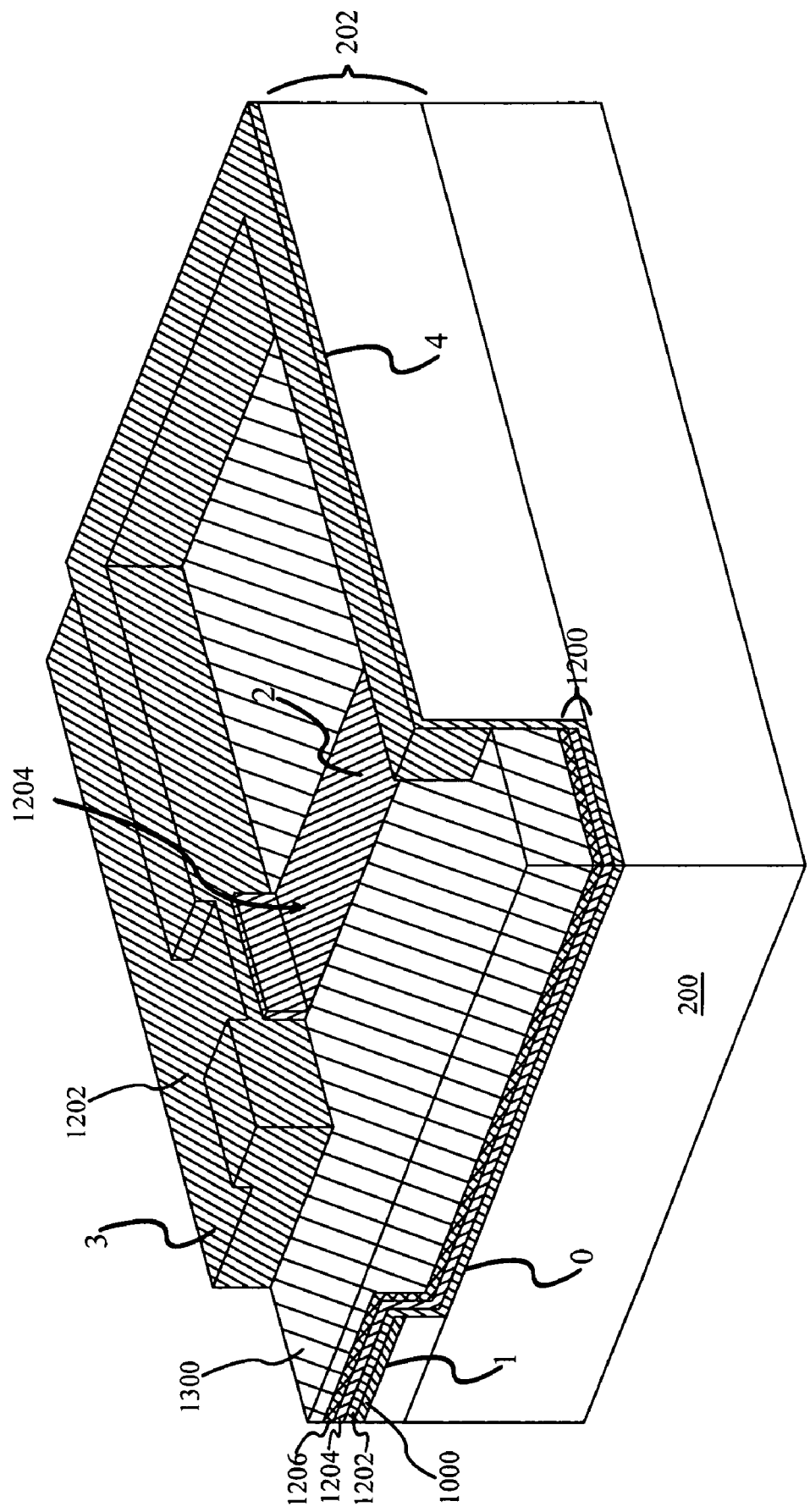
FIG. 17 is a perspective view showing the removal of the top thin film metal layer to expose the channel.

The exposed portion of top metal layer 1206 is now removed, FIG. 17. In at least one embodiment, such removal is again performed by etching. With the portion of top metal layer 1206 vertically above toughened material 1000 now removed, the top metal layer 1206 now provides electrical conductors on either side of toughened material 1000 forming the gate electrode. Semiconductor layer 1204 is now exposed at level 2, and, as may be appreciated, is on top of dielectric layer 1202, which in turn is on top of toughened material 1000 (the gate electrode).

Figure 18:
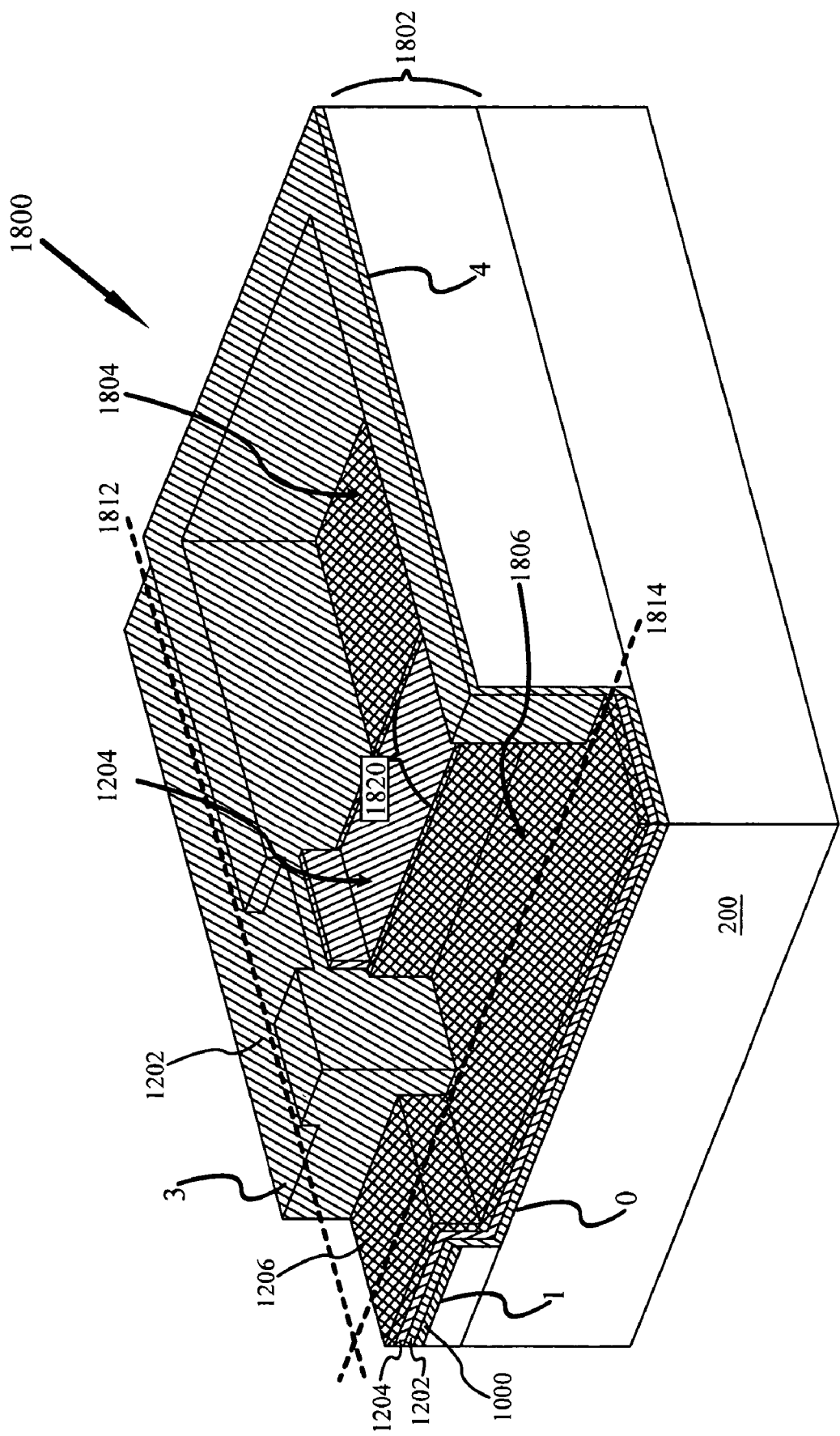
FIG. 18 is a perspective view of the resulting 3-Dimensionally contoured thin TFD with cross-over conductors.

As shown in FIG. 18, the remaining portions of the polymer 1300 may be removed. A bottom-gate TFT 1800 may now be fully appreciated. More specifically, TFT 1800 is characterized by a 3D contour substrate 1802 providing at least four substantially different vertical heights/levels. In at least one embodiment, the sidewalls rising from level 0 to level 2 adjacent to the toughened material 1000 providing the gate conductor may be angled so as to improve alignment of the patterned top metal 1206 to the gate conductor.

In the embodiment illustrated, the top metal layer 1206 has been formed into two areas—an isolated electrode area 1804 bounded by exposed dielectric layer 1202 and the semiconductor layer 1204 above the gate electrode, and a continuous conductor area 1806 running across the edge of TFT 1800. In at least one embodiment, the isolated electrode area 1804 is the control electrode for a display pixel—the isolated electrode area 1804, continuous conductor area 1806, and exposed semiconductor layer 1204 stacked upon the dielectric layer 1202 and toughened material 1000 (gate electrode) providing the source, drain and channel components of TFT 1800.

The toughened material 1000 at levels 1 and 3 provides the gate control line 1812, and the continuous conductor area 1806 of top metal layer 1206 provides a data line 1814. As 3D structure 1802 is repeated across substrate 200, there are a plurality of substantially parallel gate control lines 1812 crossed by a plurality of data lines 1814. As each TFT 1800 is adjacent to the cross point intersection of a gate control line 1812 and a data line 1814, any TFT 1800 within the array may be selected for activation or deactivation by selecting the appropriate crossing lines.

Moreover, the active matrix of TFTs 1800 may be described as having a 3D contoured substrate having at least four substantially different vertical heights. A plurality of parallel gate control lines 1812 follow the 3D contour from a first intermediate vertical height to a second intermediate vertical height above the first intermediate vertical height (level 1 to level 3 as shown). A plurality of gate electrodes are physically coupled to each gate control line 1812, and each gate electrode is proximate to an intermediate vertical height (level 2 as shown) between the first and second intermediate vertical heights.

A channel 1820 is disposed upon each gate electrode. A plurality of parallel data lines 1814 are electrically isolated from, and cross, the gate control lines 1812. Each data line 1814 is electrically coupled to at least one channel 1820. An individually bounded electrode (isolated electrode area 1804), is also electrically coupled to each channel 1820, opposite from a data line 1814. Device isolation areas are provided by the highest vertical height of the 3D structure, and as shown, may further include a dielectric layer 1202 coating. The provided array is a highly durable structure advantageously suited for flexible environments and applications.

In further addition, the pattern reversal process, when combined with a SAIL process, permits the fabrication of TFDs on smaller scales than are traditionally possible with photolithographic techniques. With respect to the exemplary TFT 1800, such high resolution permits the establishment of a high quality channel. Channel length and uniformity are important factors in determining TFT performance. Minimum channel length and uniformity are only limited by imprint resolution. The SAIL imprinting process and pattern reversal process described above advantageously permit the fabrication of channel lengths less than one micron.

As the physical structure of the TFT 1800 is established by the 3D contour substrate 1802, which in turn is established by an imprinting process, there is minimal overlap between the top metal layer providing the source/drain electrodes proximate to the gate electrode provided by the toughened material 1000. That there is an overlap between the gate control line 1812 and data line 1814 where the two control lines cross is largely irrelevant as the top metal layer 1206 is contiguous in the area of overlap and therefore no TFT behavior is observed.

It is to be appreciated that the alignment of the source, drain and gate electrodes for the TFTs 1800 of the array is established at the outset, or at least very early on in the fabrication process, and is not subject to skew or later misalignment as occurs with traditional lithographic processes. As such, the TFT 1800 advantageously minimizes parasitic capacitance.

Although discussed with respect to a TFT 1800, it is understood and appreciated that embodiments of the pattern reversal process may also provide via contacts and other structures that are otherwise difficult to achieve in roll-to-roll processing, but which may be desired. It is to be understood and appreciated that although the figures above illustrate the fabrication of a single TFT 1800, the pattern reversal process and established cross-over between the data line 1814 and gate control line 1812 is performed substantially simultaneously across a large substrate to provide an active matrix array.

Such an active matrix array, and specifically the isolated electrode area 1804, may be used as pixel electrodes in a display screen. More specifically, a plurality of TFTs may be provided as an active matrix backplane for a display screen. In such embodiments, the TFTs control the display pixels (at least one TFT per pixel). It is understood and appreciated that, with respect to the viewer, the pixels may be in front of the backplane and thus facing the viewer, or behind the transparent backplane and thus shining through the backplane to reach the viewer.

With large pixels or small pixels, it is possible to achieve transparent or semi-transparent display screens via the use of transparent materials discussed above. Depending upon the thickness of the etched thin film layers 1200, to some extent, TFDs made with common materials such as Al, Au, Cu, Si, SiN, Cr or the like may also be used to provide TFDs and matrix conductors of sufficiently small and thin size so as not to be visually obvious or intrusive. In other words, the TFDs may be designed to have small enough thicknesses and small enough widths and intervening aperture spacing between components that they are nearly transparent and/or the loss of light due to absorption is minimal.

Moreover, a transparent TFD may be provided by utilizing transparent materials; by providing devices of such minute scale and with intervening aperture spacing, or by combining both transparent materials with a minute scale. The ability to provide a matrix of high quality TFDs as transparent or semi-transparent backplane displays may be highly desirable in the fabrication of video displays. For example, heads up displays as might be used to display navigation information on the windshield of a vehicle (car, aircraft, submarine, etc. . . . ) may advantageously be easily fabricated.

Changes may be made in the above methods, systems and structures without departing from the scope thereof. It should thus be noted that the matter contained in the above description and/or shown in the accompanying drawings should be interpreted as illustrative and not in a limiting sense. The following claims address all generic and specific features described herein, as well as all statements of the scope of the present method, system and structure which, as a matter of language, might be said to fall therebetween.

What is claimed is:

1. A method of fabricating an active matrix of thin film devices, comprising:
    providing a substrate; and
    utilizing a self-aligned imprint lithography (SAIL) process with pattern reversal to form an active matrix array of thin film devices.

2. The method of claim 1, wherein the substrate is flexible.

3. The method of claim 1, wherein the method is performed as a roll-to-roll process.

4. The method of claim 1, wherein the thin film devices are thin film transistors.

5. The method of claim 1, wherein the SAIL process with pattern reversal comprises:
    providing a 3D structure upon the substrate;
    depositing at least one layer of material upon the 3D structure;
    establishing a pattern upon the layer of material, the pattern providing a plurality of exposed areas and a plurality of covered areas;
    treating the exposed areas of the layer of material to provide a plurality of etch resistant areas of material, the covered areas remaining etch susceptible;
    removing the pattern;
    etching the layer of material to remove the etch susceptible areas of material;
    depositing at least one additional material layer upon the remaining etch resistant material and 3D structure; and
    processing the additional material layer in accordance with the desired characteristics of the thin film devices.

6. The method of claim 5, wherein treating the exposed areas provides a plurality of toughened areas, the covered areas remaining un-toughened.

7. The method of claim 5, wherein the etch resistant properties of the treatment are removed following the etching of the etch susceptible areas and before the depositing of the additional material layer.

8. The method of claim 5, wherein the pattern is established by treating, comprising:
    depositing a planarization material and removing a portion of the planarization material, thereby exposing a portion of the layer of material, wherein the treating reverses the pattern upon the layer of material.

9. The method of claim 5, wherein the remaining etch resistant material is conductive and depositing at least one additional material layer upon the remaining etch resistant material further comprises:
    depositing a dielectric layer;
    depositing a semiconductor layer upon the dielectric layer; and
    depositing a top metal layer upon the semiconductor layer.

* * * * *